United States Patent [19]

Eckel et al.

[11] Patent Number: 4,727,934
[45] Date of Patent: Mar. 1, 1988

[54] DATA COLLECTION TERMINAL DESIGNED FOR A HOSTILE ENVIRONMENT

[75] Inventors: Carl C. Eckel; Jay A. Kaplan, both of Wayland, Mass.

[73] Assignee: Honeywell Information Systems Inc., Waltham, Mass.

[21] Appl. No.: 916,144

[22] Filed: Oct. 7, 1986

Related U.S. Application Data

[63] Continuation of Ser. No. 538,048, Sep. 30, 1983, abandoned.

[51] Int. Cl.⁴ .................. H05K 7/20; F28F 7/00
[52] U.S. Cl. .................. 165/104.33; 361/384; 361/426; 165/104.34
[58] Field of Search ......... 165/80.3, 104.34, 104.33, 165/47; 361/383, 384, 386, 395, 399, 426

[56] References Cited

U.S. PATENT DOCUMENTS

| | | | |
|---|---|---|---|
| 3,601,661 | 8/1971 | Kleinhample, Jr. | 361/395 X |
| 3,962,608 | 6/1976 | Forster et al. | 361/384 |
| 4,187,528 | 2/1980 | Morriss | 361/399 |
| 4,323,979 | 4/1982 | Johnston | 361/390 X |
| 4,495,545 | 1/1985 | Dufresne et al. | 361/384 |
| 4,587,593 | 5/1986 | Leautaud et al. | 361/395 X |

FOREIGN PATENT DOCUMENTS

| | | | |
|---|---|---|---|
| 1128887 | 10/1968 | United Kingdom | 361/384 |
| 700941 | 12/1979 | U.S.S.R. | 361/384 |

*Primary Examiner*—Albert W. Davis, Jr.
*Assistant Examiner*—Peggy A. Neils
*Attorney, Agent, or Firm*—George Grayson; John S. Solakian

[57] ABSTRACT

A data entry terminal for use in a hostile environment is sealed from the outside environment. The terminal has a housing made up of a front panel, shroud and base plate that are fastened together in two different orientations to facilitate desk top and wall mounting, and electronic equipment is mounted inside the terminal enclosure. A fan circulates air around the inside of the terminal enclosure for cooling the electronic equipment inside. The enclosure base acts as a heat sink to transfer the heat to the outside environment in whatever position the terminal is mounted.

3 Claims, 9 Drawing Figures

WALL MOUNTED FACTORY DATA COLLECTION TERMINAL

WALL MOUNTED FACTORY DATA COLLECTION TERMINAL

DESK MOUNTED FACTORY DATA
COLLECTION TERMINAL

SECTION A-A

DATA COLLECTION TERMINAL DESIGNED FOR A HOSTILE ENVIRONMENT

This application is a continuation of application Ser. No. 538,048, filed 9/30/83 now abandoned.

RELATED APPLICATION

The following U.S. patent application filed on an even date with the instant application and assigned to the same assignee as the instant application is related to the instant application and is incorporated herein by reference.

"A Wall or Desk Mounted Data Collection Terminal" by Jay A. Kaplan and Peter Place, having U.S. Ser. No. 823,919 pending and filed on Jan. 30, 1986.

BACKGROUND OF THE INVENTION

1. Field of the Invention

This invention relates to a data collection terminal and more particularly to a terminal which operates in a hostile environment such as a factory or a warehouse.

2. Description of the Prior Art

Many of the factories and warehouses have what is commonly called a hostile environment. Very often it is a dusty, oily environment and the floors may vibrate as lift trucks pass by or heavy machine tools are operating. However, there is a need to collect information from the factory or warehouse floor. This information may include additions or subtractions from inventory, parts in process status, machine-operator production, rejected parts, etc. To this end a number of systems have been developed wherein terminals placed on the factory floor are wired to a central computing system. Operators with greasy hands may operate the terminal by one or a combination of the following: placing their badge into a badge reader, using a hand-held wand to scan encoded data, or keying in the required information.

The data collection problem has been solved by a number of manufacturers. IBM in their 3630 Plant Communication System includes a 3641 reporting terminal, a 3643 keyboard display and a 3646 scanner control unit including a magnetic slot reader and a magnetic hand scanner.

Burroughs Corporation provides the MT 1500 which is "a free-standing microprocessor-based system, designed to be used as a worker-operated manufacturing-/distribution terminal in the warehouse, on the factory floor, and in other rugged, production oriented environments."

Sierra Information Systems Corporation provides the Sierra shop terminal ST-2000 which is "a multiple function shop terminal designed for customer application in hostile environments". The ST-2000 can be wall or table mounted.

Hewlett Packard provides the 3075A, 3076A and 3077A Data Capture Terminals. The desk mounted 3076A may be converted to the wall mounted 3075A by reversing the keyboard assembly. This results in the wall mounted terminal having all peripheral devices including the display in a different location from an operator's standpoint than the desk mounted terminal.

OBJECTS OF THE INVENTION

It is an object of the invention to provide an improved data collection terminal housing.

It is another object of the invention to provide a data collection terminal housing which is operated in a hostile environment.

It is yet another object of the invention to provide a data collection terminal housing which may be mounted vertically or horizontally.

It is still another object of the invention to design a data collection terminal housing that is sealed from the outside environment but which does not overheat.

SUMMARY OF THE INVENTION

A data entry terminal housing for use in a hostile environment includes a housing in which are a power supply, a fan, electronic circuit components and a number of pieces of input/output equipment. By the changing the orientation in which a front panel, shroud, and base plate that make up the housing of the terminal the terminal may be desk mounted or wall mounted.

When the front panels, shroud, and base plate are assembled along with input/output equipment that are mounted in openings of the terminal housing the terminal is sealed so that none of the dust laden or chemical laden air enters the enclosure. Openings for cards or badges of input equipment are located in a downward position which prevents foreign matter from falling into the slot.

A fan circulates the air inside the terminal to prevent hot spots from forming around the electronic circuit components and the power supply. The base of the terminal acts as a heat sink to transfer the heat generated inside the enclosure to the outside environment.

To facilitate desk mounting and wall mounting a front panel of the terminal housing mounts in a first position with respect to a shroud and base plate for the desk mounting, and mounts in a second position which is 180° from said first position for the wall mounting. The two different positions permit input/output equipment to be easily seen and operated no matter if the terminal housing is wall mounted or desk mounted.

BRIEF DESCRIPTION OF THE DRAWINGS

The novel features which are characteristic of the invention are set forth with particularity in the appended claims. The invention itself, however, both as to organization and operation may best be understood by reference to the following description in conjunction with the drawings in which:

DESCRIPTION OF THE PREFERRED EMBODIMENT

Figure 1A:
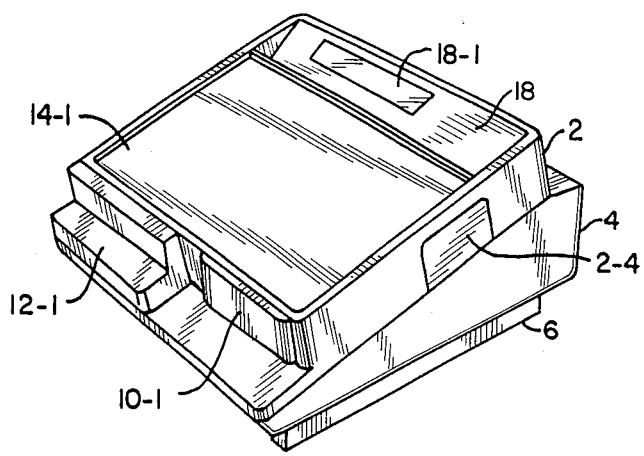
FIGS. 1A and 1B show the external features of the desk mounted terminal without and with accessories.
Figure 1B:
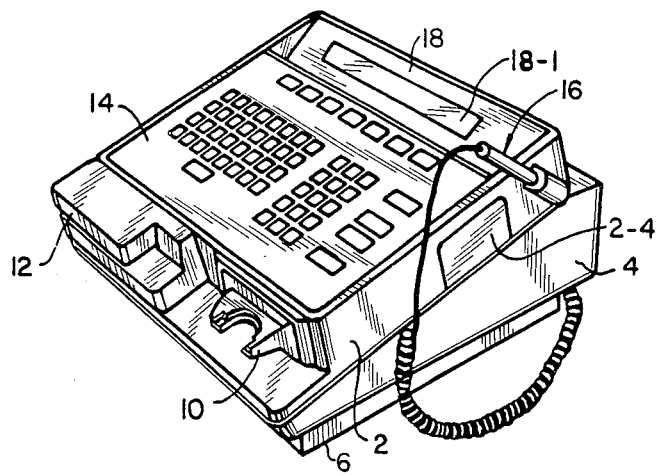

FIG. 1A shows the desk mounted factory data collection terminal without the accessories and FIG. 1B shows the desk mounted factory data collection terminal with accessories including a badge reader 10, a swipe reader 12, a keyboard 14, a display panel 18 and a wand reader 16. FIGS. 1A and 1B also show a front panel 2, a shroud 4 and a base plate 6.

Figure 2A:
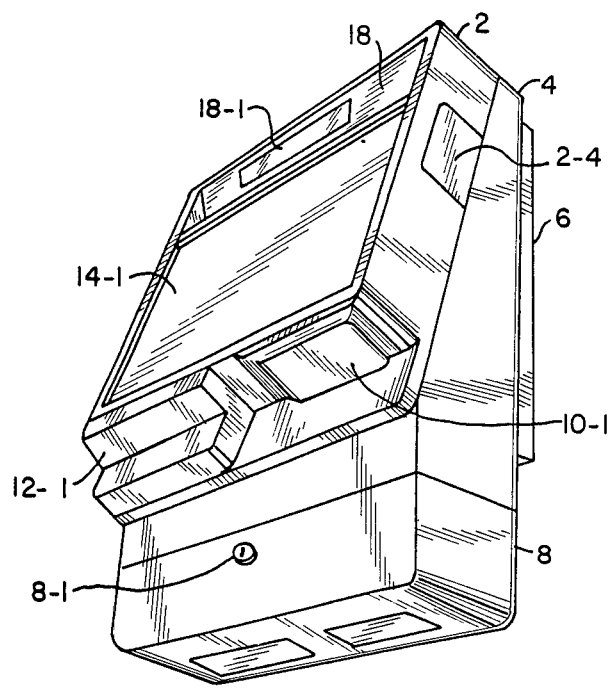
FIGS. 2A and 2B show the external features of the wall mounted terminal without and with accessories.
Figure 2B:
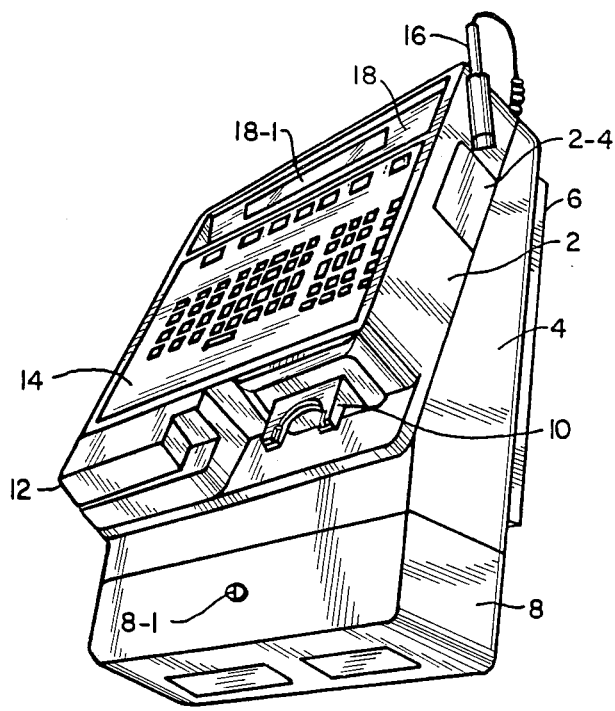

FIG. 2A shows the wall mounted factory data collection terminal without the accessories and FIG. 2B shows the wall mounted factory data collection terminal with accessories including badge reader 10, swipe reader 12, keyboard 14, wand reader 16 and display panel 18.

With the exception of a security conduit cover 8, a security keylock 8-1, and a wall bracket 8-2, both the desk mounted and wall mounted factory data collection terminals have the same elements. The one difference, assuming the same accessories, is that the front panel 2 is positioned 180° relative to a bottom piece made up of the base plate 6 and the shroud 4 for the desk mounted terminal as compared with the wall mounted terminal. That is, for the wall mounted unit the shroud 4 is mounted with the small thickness dimension side 4-1 at the top and the large thickness dimension side 4-2 at the bottom as in FIGS. 2A and 2B. For the desk mounted terminal unit, the shroud 4 is mounted with the small thickness dimension side 4-1 to the front and the large thickness dimension side 4-2 to the rear as in FIGS. 1A and 1B.

The desk mounted terminal of FIG. 1A and the wall mounted terminal of FIG. 2A have a cover 10-1 if the terminal does not have the badge reader 10, a cover 12-1 if the terminal does not have a swipe reader 12 and an optional wand 16. The terminal design allows several display options 18-2, shown in FIG. 3 including a clock display and single and multi-line alphanumeric displays. A cover 2-4 seals an opening in the front panel 2 and provides a space for the installation of a multi-function card reader (not shown). The desk mounted or wall mounted terminal may have a graphics panel 14-1 in place of the keyboard 14 if user keyboard entry is not required.

The covers 2-4, 10-1, and 12-1, display label 18-1, and keyboard 14 or graphics panel 14-1 keep dust from inside of the terminal by providing a seal against the front panel 2.

Figure 3:
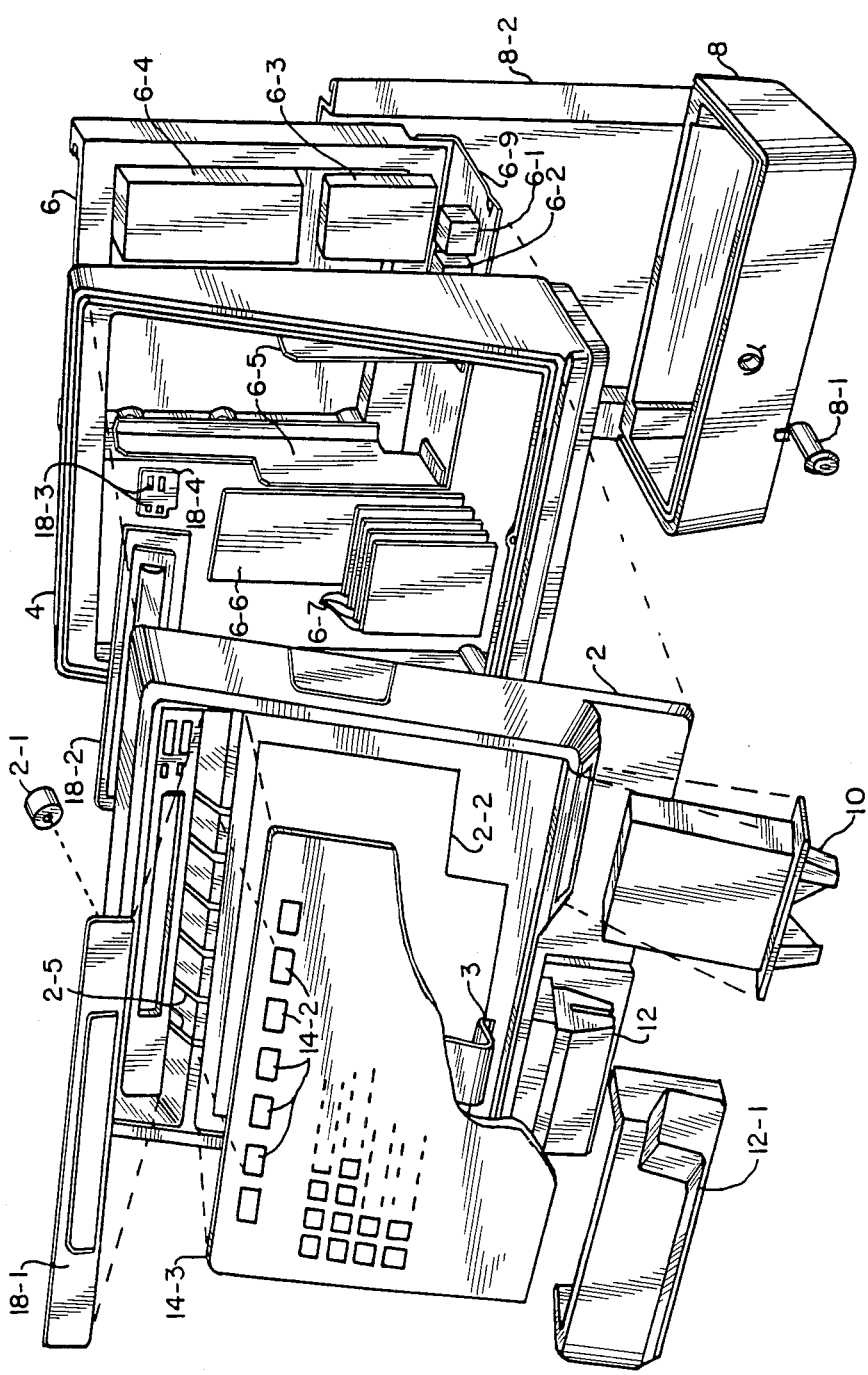
FIG. 3 breaks out the detail components of the wall mounted terminal.
Figure 4:
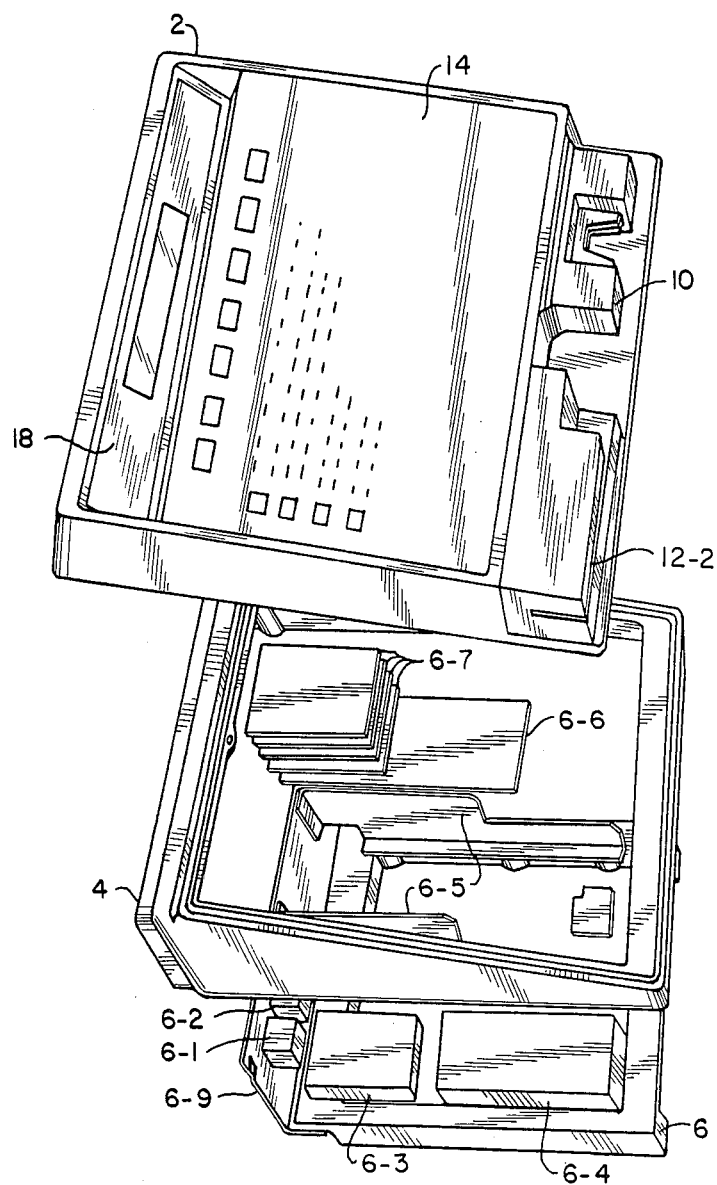
FIG. 4 breaks out enough of the detail components of the desk mounted terminal to show the relative position of the front panel 2 with respect to the base plate 6 for comparison with the orientation of FIG. 3.

FIG. 3 shows further detail of the wall mounted terminal and FIG. 4 shows further detail of the desk mounted terminal. Mounted to the base plate 6 is a power supply 6-4 which provides direct current power to the terminal and one or more fans 6-3 which circulates the air within the terminal thereby preventing hot spots. Since the terminal is usually in a hostile environment, the terminal is sealed. No new air is brought into the terminal. The existing air is recirculated and the heat is dissipated through the aluminum base plate 6.

A panel 6-9 is mounted at right angles to the base plate 6 and has mounted to it a circuit breaker 6-1 which protects the terminal when the AC line current exceeds the current limits of the circuit breaker 6-1. Also mounted to the panel 6-4 is a line filter 6-2 which prevents voltage spikes from being imposed on the power supply 6-4.

Also mounted to panel 6-9 are brackets 6-5 into which are mounted a mother board 6-6 which controls the basic logic of the terminal and up to four daughter boards 6-7. Each daughter board 6-7 controls an accessory and is electrically coupled to the mother board 6-6.

A display label 18-1, FIG. 3, acts as a filter to enhance a display 18-2 and indicator lights 18-3 mounted on a printed circuit board 18-4. The display label 18-1 also seals off the opening in front panel 2 to prevent damage to the terminal from liquid or other contaminants.

Six depressions 2-5 in the front panel 2 line up functions displayed on the display 18-2 with 5 function keys 14-2 on keyboard 14. This enables information on display 18-2 to define for the operator the function that the terminal will perform when a particular function key 14-2 is depressed.

The keyboard 14 which fits within a depression in front panel 2 has a gasket 14-3, typically neoprene, which again seals the inside of the terminal from liquid or other contaminants. The keyboard 14 provides keys using a membrane-type technology.

The swipe reader 12 may be a bar code reader or a magnetic card reader. The operator places a card in the slot and "swipes" the card past a read head in the swipe reader 12.

The operator places an identifying badge in the badge reader 10. The badge reader 10 may read holes in the badge.

The badge and card openings in the badge reader 10 and the swipe reader 12 face downward to minimize the possibility of contaminants from entering the readers, thereby reducing the number of service calls.

If the terminal does not include a badge reader, then a cover 10-1, FIGS. 1A and 2A, seals the badge reader 10 opening. Similarly, a cover 12-1 seals the opening if the terminal does not include a swipe reader.

An alarm 2-1 is mounted on front panel 2 to alert the operator of an error condition.

A printed circuit board 2-2 which defines the personality of the terminal provides the logic that communicates with all of the peripheral devices installed in the terminal.

The terminal may be designed to perform a specific function such as to record time and attendance or as a labor reporting terminal. For the time and attendance terminal, display 18-2 would be a clock display and show the time of day. For the labor reporting terminal, the display 18-2 is either a one row by forty character or a two row by forty character display.

Note that the front panel 2 of the desk mounted terminal of FIG. 4 is shown in FIG. 3 displayed 180 degrees with respect to shroud 4 and base plate 6. Assuming the same orientation of shroud 4 and base plate 6, front panel 2 is rotated 180 degrees to convert from a desk mounted to a wall mounted terminal or to convert from a wall mounted to a desk mounted terminal.

Figure 5:
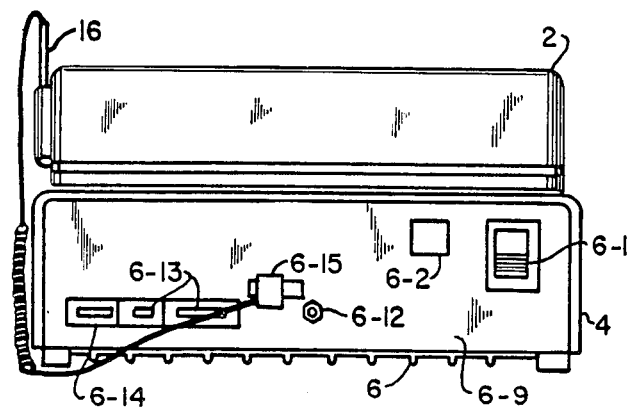
FIG. 5 shows a rear view of the desk mounted terminal.

FIG. 5 shows a back view of the desk mounted terminal. The panel 6-9 has mounted on it a combination circuit breaker/power-on switch 6-1, a line filter with AC receptacle 6-2 for connecting an external power cable, a receptacle for the wand reader signal cable plug 6-15, a coaxial cable connector 6-12, connectors 6-13 to provide auxiliary communications and relay ports on the mother board, and a binary switch 6-14 which assigns a terminal identification code to the terminal.

Figure 6A:
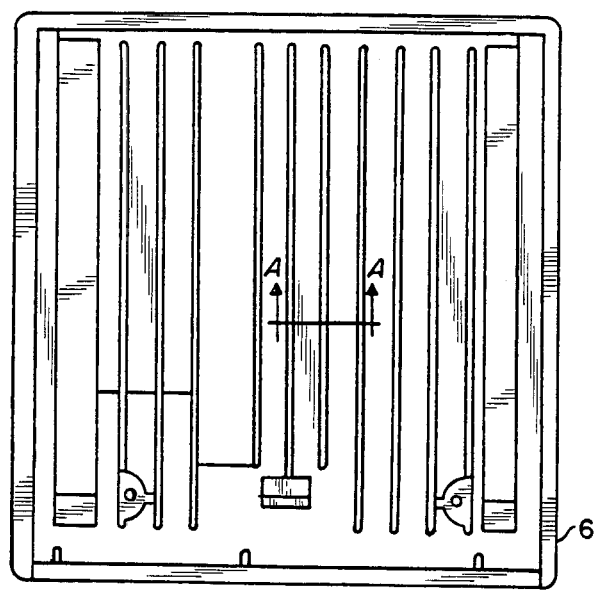
FIG. 6 shows the base plate which acts as a heat sink.
Figure 6B:
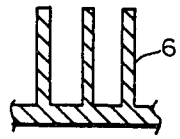

FIG. 6 shows the details of base plate 6. The fin dimensions are shown in Section AA as being $\frac{1}{4}$ inch thick and $1\frac{1}{4}$ inches high with a $\frac{3}{8}$ inch space between adjacent fins. The base plate 6 thickness is typically $\frac{1}{4}$ inch. The aluminum base plate 6 in cooperation with the fan 6-3 results in the heat circulated in the ambient air within the terminal being passed into the base plate 6 and transferred to the external environment.

Having shown and described a preferred embodiment of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. A data entry terminal housing for mounting and sealing electronic equipment for use in a hostile environment and the terminal is made up of a number of parts that are attached together in more than one physical arrangement so that said terminal housing may be wall mounted or desk top located, said terminal housing having openings to mount and seal with input/output equipment for interfacing with said electronic equipment, said terminal housing comprising:

a bottom piece in which are contained said electronic equipment, said bottom piece having opposite first and second sides that are not parallel to each other, and said first side is a wall having a plurality of cooling fins as part thereof and facing the outside of said terminal housing, a front panel means fastenable to said second side of said bottom piece in more than one position while creating a hermetic seal between them to thereby protect said electronic equipment from the hostile environment, said front panel means having a plurality of openings for receiving and sealing with said input/output equipment which interfaces with said electronic equipment, ones of said openings being sealed when a piece of input/output equipment is not mounted therein, said front panel being fastened to said bottom piece in a first position when said terminal housing is wall mounted to facilitate access to said input/output equipment, and said front panel being fastened to said bottom piece in a second position when said terminal housing is to be desk top located to facilitate access to said input/output equipment, and air circulating means inside said sealed terminal housing to move air over said electronic equipment to remove heat therefrom, said heated air also being circulated over said first side wall of said bottom piece to transfer said heat therethrough to said fins which dissipate the heat to air outside said terminal housing.

2. The data entry terminal housing in accordance with claim 1 further comprising a mounting plate which is fastened to an upright surface, said bottom piece being fastened to said mounting plate for vertically mounting said terminal housing.

3. The data entry terminal housing in accordance with claim 2 wherein said openings in said front panel means receive ones of said input/output equipment so that in conjunction with said first and said second positions between said front panel and said bottom piece of said terminal, visual display output equipment is easily viewed and input equipment is easily seen and operated both when said terminal is wall mounted and is desk top located.

* * * * *